(12) United States Patent  
Amano

(10) Patent No.: US 7,272,367 B2  
(45) Date of Patent: Sep. 18, 2007

(54) MULTIBAND FILTER CIRCUIT AND HIGH-FREQUENCY TRANSMITTER

(75) Inventor: Yoshihisa Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 664 days.

(21) Appl. No.: 10/844,450

(22) Filed: May 13, 2004

(65) Prior Publication Data

US 2004/0229576 A1    Nov. 18, 2004

(30) Foreign Application Priority Data

May 15, 2003   (JP)   ............................ P2003-137012

(51) Int. Cl.
*H04B 1/10* (2006.01)
(52) U.S. Cl. .................. 455/114.2; 333/132; 333/134; 333/135; 455/552.1
(58) Field of Classification Search ................ 455/326, 455/330, 293, 313, 316, 317, 318, 320, 552.1, 455/323, 324, 553.1, 118, 307, 196.1, 258, 455/73, 85, 86, 327; 333/202, 204, 132, 333/134, 135; 327/113
See application file for complete search history.

(56) References Cited

U.S. PATENT DOCUMENTS

| 6,549,097 | B2 * | 4/2003 | Guillon et al. ............... 333/174 |
| 2003/0102941 | A1 | 6/2003 | Amano et al. |

FOREIGN PATENT DOCUMENTS

| JP | 2000-124705 A | 4/2000 |
| JP | 2002-26605 A | 1/2002 |

OTHER PUBLICATIONS

Yoshihiro Konishi et al., "Design and Applications of filter circuits for communications" 1st Edition Feb. 1, 1994 p. 26, Fig. 2.27 (b).

* cited by examiner

*Primary Examiner*—Edward F. Urban
*Assistant Examiner*—Christian A. Hannon
(74) *Attorney, Agent, or Firm*—Birch, Stewart, Kolasch & Birch, LLP

(57) ABSTRACT

The input side and the output side of a first bandpass filter circuit BPF1a are magnetically coupled to each other in a jump-coupling manner by the first mutual inductance (L31a, L41a) for connection between an input port IN and the input side of the first bandpass filter circuit BPF1a and connection between an output port OUT and the output side of the bandpass filter circuit BPF1a. The input side and the output side of a second bandpass filter circuit BPF2a whose center frequency is higher than that of the first bandpass filter circuit BPF1a are magnetically coupled to each other in a jump-coupling manner by the second mutual inductance (L32a, L42a) for connection between the input side of the first bandpass filter circuit BPF1a and the input side of the second bandpass filter circuit BPF2a and connection between the output side of the first bandpass filter circuit BPF1a and the output side of the second bandpass filter circuit BPF2a. This multiband filter circuit is capable of improving the degree of steepness by generating a number of transmission zeros in the vicinity of a plurality of passbands with a simple construction.

10 Claims, 11 Drawing Sheets

US 7,272,367 B2

MULTIBAND FILTER CIRCUIT AND HIGH-FREQUENCY TRANSMITTER

This Nonprovisional application claims priority under 35 U.S.C. §119(a) on Patent Application No. P2003-137012 filed in Japan on May 15, 2003, the entire contents of which are hereby incorporated by reference.

BACKGROUND OF THE INVENTION

The present invention relates to a multiband filter circuit that has a plurality of passbands and to a high frequency transmitter that employs the circuit.

The present specification supposes a high-frequency band system for digital wireless communications and so on, and therefore, filter characteristics are hereinafter each expressed in a 50-Ω system S-parameters graph. With regard to the filter characteristics, an S11-parameter represents a reflection coefficient, and an S21-parameter represents a transmission coefficient. Moreover, all the graphs of the S11-parameter and the S21-parameter show theoretical calculation results obtained by a general circuit simulator (GENESYS7.0 of EAGLEWARE Corp.) available on the market.

First of all, the fundamental BPF (bandpass filter) circuit will be described before proceeding to the explanation of a multiband filter circuit. FIG. 11 shows one example of the structure of a most fundamental prior art BPF.

FIG. 11 shows a well-known circuit structure that is practically often used in a high-frequency band and serves as a resonator-coupled type bandpass filter circuit constituted mainly of electric field coupling. This bandpass filter circuit is the circuit that is disclosed in, for example, "Design and Applications of filter circuits for communications" (written by Yoshihiro Konishi, published by Sougou-Denshi Shuppan, 1st Edition, p.26, FIG. 2.27(b)) and has a number n of stages of n=2.5 commencing from the series capacitance located between the stages. In FIG. 11, there are shown resonator sections 1 and 2. One example of the characteristic of this bandpass filter circuit is shown in FIG. 14, which includes only one passband. The circuit constants when this result was obtained were C1g=C2g=5.451 pF, C3g=C5g=1.343 pF, C4g=0.679 pF, and L1g=L2g=2.267 nH.

Although there is shown the case of the circuit of the minimum construction that has only two resonator sections 1 and 2, it is well known that the number of stages can easily be increased or decreased in such a bandpass filter circuit. Although the present specification provided below mentions only circuit diagrams and simulation results in the case where the number of resonators is two for the sake of simplicity of explanation, neither the prior art nor the present invention described in the present specification is limited by the number of resonators.

Although the case of an ideal equivalent circuit constructed of only lumped-constant elements (L and C) is shown in FIG. 11, it is well known that this circuit can also be provided by a distributed constant circuit. For example, FIG. 12 shows an example in which only the resonator sections 1 and 2 in FIG. 11 are replaced by λ/4 shortcircuit resonators TL1h and TL2h of distributed constant transmission lines. FIG. 13 shows an example in which the capacitance elements C1h, C2h and C3h in FIG. 12 are replaced by gap capacitances 27, 28 and 29 between the distributed constant transmission lines and the λ/4 shortcircuit line resonators TL1h and TL2h are replaced by λ2 open-circuited line resonators 25 and 26. In FIG. 13, there are shown a dielectric substrate 21 of ceramic, glass epoxy or the like, a ground pattern 22 on the lower surface of the substrate, and metal wiring patterns 23 and 24 formed on the upper surface of the substrate. The patterns 23 and 24 constitute a high-frequency transmission line called the microstrip line in the case of FIG. 13.

In the present specification provided below, circuit diagrams and simulation results in the distributed constant transmission line form as in FIGS. 12 and 13 are not shown for the sake of simplicity of explanation. However, neither the prior art nor the present invention described in the present specification is limited to the lumped constant form as in FIG. 11.

As is apparent from FIGS. 11 through 13, the resonator-coupled type bandpass filter circuit is the technology that has a number of derivative forms and is widely put to practical use. It is impossible to describe all these derivative forms in the present specification. The essence of the present invention described later is shown in FIGS. 7 through 9, and the structure of the bandpass filter circuit is not limited only to FIGS. 11 through FIG. 13.

The present specification is focused on a filter circuit that has a plurality of passbands, or a so-called multiband filter circuit.

There is a prior art multiband filter circuit shown in FIGS. 15 and 16 (refer to, for example, JP 2000-124705 A (see FIGS. 4, 13 and 26).

FIG. 15 shows a figure of the principle of a first prior art multiband filter circuit. This multiband filter circuit shown in FIG. 15 has a structure in which two bandpass filter circuits 31 and 32 of different center frequencies are connected parallel to each other. Impedance matching cannot be achieved if the circuits 31 and 32 are simply connected parallel to each other and the filter waveform disadvantageously collapses. Therefore, matching is achieved by four phase shifters 33, 34, 35 and 36. Due to the four phase shifters 33, 34, 35 and 36, the multiband filter circuit of FIG. 15 generally tends to have a large size.

Moreover, FIG. 16 shows a figure of the principle of a second prior art multiband filter circuit. This multiband filter circuit shown in FIG. 16 has a structure in which two bandpass filter circuits BPF1i and BPF2i of different center frequencies are connected parallel to each other. It is to be noted that this circuit differs from the multiband filter circuit of FIG. 15 in that the individual bandpass filter circuits 31 and 32 have different structures and two (35, 36) of the phase shifters are removed. However, the other two (33, 34) of the phase shifters remain unable to be removed, and this is a factor for hindering the size reduction of the circuit.

The prior art multiband filter circuits as described above have several problems.

A first problem is that the number of passbands to be provided is able to be increased up to two but not able to be increased to three or more. For example, according to the recent portable telephones, there has been demanded a triple-band type terminal that utilizes three or more frequency bands such as the initial PDC system (800-MHz band) and the subsequently expanded PDC system (1.5-GHz band) and W-CDMA system (2-GHz band). It is difficult for the prior art multiband filter circuits to cope with such a high frequency transmitter.

A second problem is that the degree of steepness of the filter characteristic is low as described later. In the case of a single unit bandpass filter circuit as shown in FIG. 11, there is known a designing method for increasing the degree of steepness by forming a transmission zero in the vicinity of the passband as a derivation form. However, in the case of the multiband filter circuit of which the structure is more complicated, it is the current situation that no design theory for freely forming a transmission zero has been established. In the case of the second prior art multiband filter circuit (FIG. 16), it is disclosed that a total of four transmission zeros can be formed in JP 2000-124705 A. However, as is apparent from this document of JP 2000-124705 A, a transmission zero is formed only in a frequency band comparatively remote from the passband, and the degree of steepness is consequently not so improved (particularly in the vicinity of the higher frequency side of the passband).

A third problem is that it is difficult to reduce the size of the circuit. The problem of the large size of the first prior art shown in FIG. 15 is pointed out in the document of JP 2000-124705 A. Moreover, according to the second prior art shown in FIG. 16, the two transmission lines TL31$i$ and TL41$i$ for phase adjustment cannot be removed as already pointed out in the present specification, and therefore, it is also difficult to reduce the size of the circuit in the low frequency band in which the wavelength $\lambda$ is long.

SUMMARY OF THE INVENTION

Accordingly, a first object of the present invention is to provide a multiband filter circuit that has a high degree of steepness and is able to form a transmission zero very close to every one of a plurality of passbands with a simple construction.

A second object of the present invention is to provide a multiband filter circuit that is able to easily cope with an increase in the number of passbands to three or more with a simple construction.

Moreover, a third object of the present invention is to provide a multiband filter circuit that is able to reduce the circuit size even in a comparatively low frequency band particularly of about 1 to 2 GHz (frequency band of a long wavelength $\lambda$).

A fourth object of the present invention is to provide a high frequency transmitter that is able to achieve the reductions in size and weight of the entire device and improve communication quality in a communication system that uses a plurality of frequency bands.

In order to achieve the above object, there is provided a multiband filter circuit including:

a first bandpass filter circuit;

a second bandpass filter circuit having a center frequency higher than that of the first bandpass filter circuit;

first mutual inductance having an inductance component connected between an input port and an input side of the first bandpass filter circuit and an inductance component connected between an output port and an output side of the first bandpass filter circuit; and second mutual inductance having an inductance component connected between the input side of the first bandpass filter circuit and an input side of the second bandpass filter circuit and an inductance component connected between the output side of the first bandpass filter circuit and an output side of the second bandpass filter circuit, wherein the input side and the output side of the first bandpass filter circuit are magnetically coupled to each other in a jump-coupling manner by the first mutual inductance, and the input side and the output side of the second bandpass filter circuit are magnetically coupled to each other in a jump-coupling manner by the second mutual inductance. In this case, the inductance component may be not only a coil but also a device having inductance. It should be noted that the frequency bands of the first and second bandpass filters do not overlap with each other.

According to the multiband filter circuit of the above-mentioned construction, there can be provided a multiband filter circuit that has a circuit structure of a high degree of steepness with a simple construction and is able to form a transmission zero very close to every one of a plurality of passbands. The reduction in the size of the circuit can be achieved even in a comparatively low frequency band particularly of about 1 to 2 GHz (frequency band of a long wavelength $\lambda$).

Also, there is provided a multiband filter circuit including:

a plurality of first through N-th (N: an integer not smaller than two) bandpass filter circuits arranged in an ascending order of intermediate frequency and a plurality of first through N-th mutual inductances, wherein one inductance component of the first mutual inductance is connected between an input port and an input side of the first bandpass filter circuit, the other inductance component of the first mutual inductance is connected between an output port and an output side of the first bandpass filter circuit, the input side and the output side of the first bandpass filter circuit are magnetically coupled to each other in a jump-coupling manner by the first mutual inductance, one inductance component of an (n+1)-st (n=1, ..., N-1) bandpass filter circuit is connected between an input side of an n-th bandpass filter circuit and an input side of the (n+1)-st bandpass filter circuit, the other inductance component of the (n+1)-st bandpass filter circuit is connected between an output side of the n-th bandpass filter circuit and an output side of the (n+1)-st bandpass filter circuit, and the input side and the output side of the (n+1)-st bandpass filter circuit are magnetically coupled to each other in a jump-coupling manner by the (n+1)-st mutual inductance. In this case, the inductance component may be not only a coil but also a device having inductance. It should be noted that the frequency bands of the plurality of bandpass filter circuits do not overlap with one another.

According to the multiband filter circuit of the above-mentioned construction, there can be provided a multiband filter circuit that has a high degree of steepness and is able to easily cope with an increase in the number of passbands to three or more with a simple construction and form a transmission zero very close to every one of a plurality of passbands. The reduction in the size of the circuit can be achieved even in a comparatively low frequency band particularly of about 1 to 2 GHz (frequency band of a long wavelength $\lambda$).

In one embodiment of the present invention, the input port and the output port are coupled to each other additionally by a capacitance component, or mutually opposite connection points of the mutual inductances are coupled to each other by a capacitance component or intermediate points of two inductance components that constitute the mutual inductance are coupled to each other by a capacitance component. In this case, the capacitance component may be not only a capacitor but also a device having capacitance.

In one embodiment of the present invention, the mutual inductance is provided by magnetic coupling between two high-frequency transmission lines arranged roughly parallel to each other at a prescribed interval.

Also, there is provided a high frequency transmitter employing the above multiband filter circuit as an RF filter for electric wave interference prevention in an ultrawide waveband radio communication system.

According to the high frequency transmitter, size and weight of the entire device can be reduced, and the communication quality can be improved in a communication system that uses a plurality of frequency bands.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
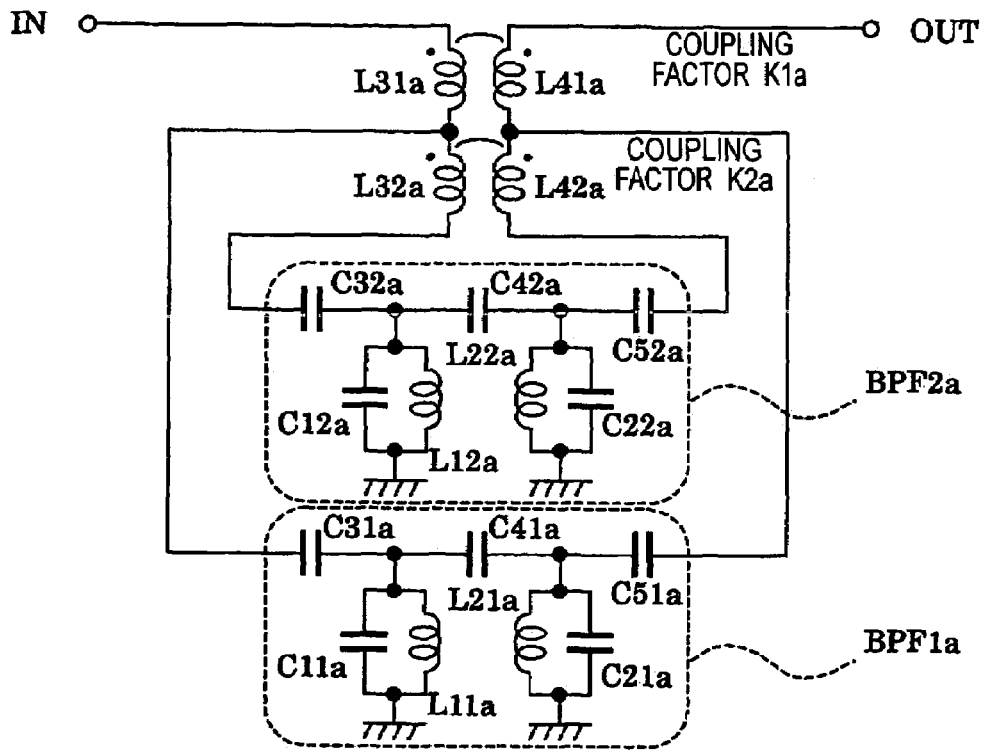
FIG. 1 is a concrete circuit diagram of a multiband filter circuit according to a first embodiment of the present invention.

The multiband filter circuit and the high frequency transmitter of the present invention will be described in detail below on the basis of the embodiments shown in the drawings.

First Embodiment

Figure 7:
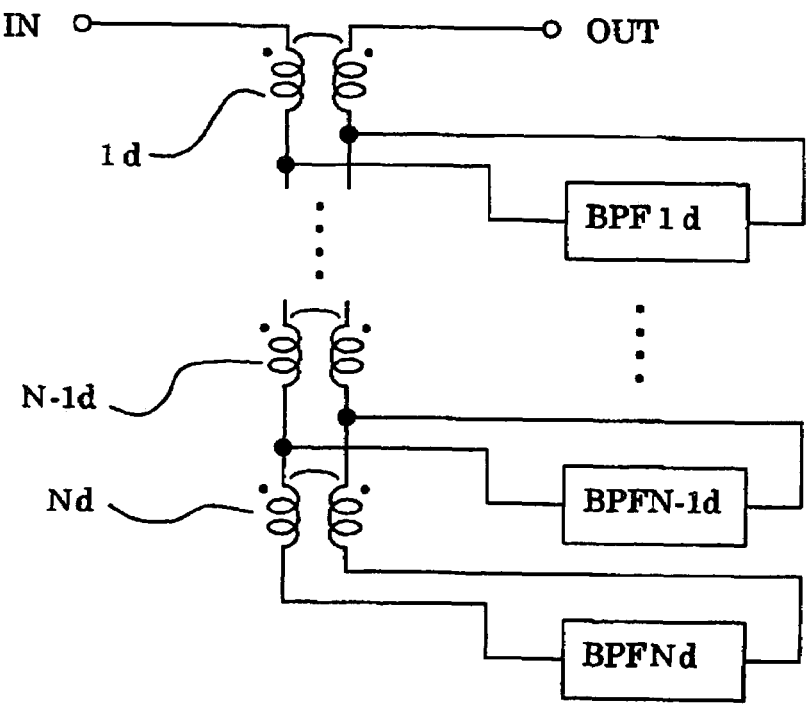
FIG. 7 is a schematic structural view of the multiband filter circuit of the first embodiment of the present invention.

FIG. 7 is a structural figure of the principle of a multiband filter circuit according to the first embodiment of the present invention. As shown in FIG. 7, this multiband filter circuit has first through N-th (N: an integer not smaller than two) bandpass filter circuits BPF1$d$ through BPFN$d$ provided in an ascending order of intermediate frequency and first through N-th mutual inductances 1$d$ through N$d$. One inductance component of the first mutual inductance 1$d$ is connected between the input port IN of this multiband filter circuit and the input side of the first bandpass filter circuit BPF1$d$, while the other inductance component of the first mutual inductance 1$d$ is connected between the output port OUT and the output side of the first bandpass filter circuit BPF1$d$. By the first mutual inductance 1$d$, the input side and the output side of the first bandpass filter circuit BPF1$d$ are magnetically coupled to each other in a jump-coupling manner. Then, one inductance component of the (n+1)-st mutual inductance (n+1)$d$ is connected between the input side of the n-th (n=1, ..., N−1) bandpass filter circuit BPF(n)$d$ and the input side of the (n+1)-st bandpass filter circuit BPF(n+1)$d$, while the other inductance component of the (n+1)-st mutual inductance (n+1)$d$ is connected between the output side of the n-th bandpass filter circuit BPF(n)$d$ and the output side of the (n+1)-st bandpass filter circuit BPF(n+1)d. By the (n+1)-st mutual inductance (n+1)d, the input side and the output side of the (n+1)-st bandpass filter circuit BPF(n+1)$d$ are magnetically coupled to each other in a jump-coupling manner. By successively providing the connections, finally, one inductance component of the N-th mutual inductance N$d$ is connected between the input side of the (N−1)-st bandpass filter circuit BPFN-1$d$ and the input side of the N-th bandpass filter circuit BPFN$d$, while the other inductance component of the N-th mutual inductance N$d$ is connected between the output side of the (N−1)-st bandpass filter circuit BPFN-1$d$ and the output side of the N-th bandpass filter circuit BPFN$d$. By the N-th mutual inductance N$d$, the input side and the output side of the N-th bandpass filter circuit BPFN$d$ are magnetically coupled to each other in a jump-coupling manner.

FIG. 1 is a concretely materialized example in which N=2. In FIG. 1, one inductance component L31$a$ of the first mutual inductance is connected between the input port IN and the input side of the first bandpass filter circuit BPF1$a$, while the other inductance component L41$a$ of the first mutual inductance is connected between the output port OUT and the output side of the first bandpass filter circuit BPF1$a$. By the first mutual inductance, the input side and the output side of the first bandpass filter circuit BPF1$a$ are magnetically coupled to each other in a jump-coupling manner. One inductance component L32$a$ of the second mutual inductance is connected between the input side of the first bandpass filter circuit BPF1$a$ and the input side of the second bandpass filter circuit BPF2$a$, while the other inductance component L42$a$ of the second mutual inductance is connected between the output side of the first bandpass filter circuit BPF1$a$ and the output side of the second bandpass filter circuit BPF2$a$. By the second mutual inductance, the input side and the output side of the second bandpass filter circuit BPF2$a$ are magnetically coupled to each other in a jump-coupling manner.

The two inductance components L31$a$ and L41$a$ of the first mutual inductance are coupled to each other by a coupling factor K1$a$, while the two inductance components L32$a$ and L42$a$ of the second mutual inductance are coupled to each other by a coupling factor K2$a$. It is to be noted that the two inductance components L31a and L41a of the first mutual inductance have black dots on same side, so that the mutual inductance becomes positive when the direction of currents flowing through the inductance components L31a and L41a is same, and the coupling factor is positive. Likewise, the two inductance components L32a and L42a of the second mutual inductance have black dots on same side, so that the mutual inductance becomes positive when the direction of currents flowing through the inductance components L32a and L42a is same, and the coupling factor is positive.

Moreover, the first bandpass filter circuit BPF1a has a structure in which three series capacitances C31a, C41a and C51a and two LC parallel resonators (the pair of C11a and L11a and the pair of C21a and L21a) are alternately connected in multiple stages. The second bandpass filter circuit BPF2a has a structure in which three series capacitances C32a, C42a and C52a and two LC parallel resonators (the pair of C12a and L12a and the pair of C22a and L22a) are alternately connected in multiple stages.

Figure 15:
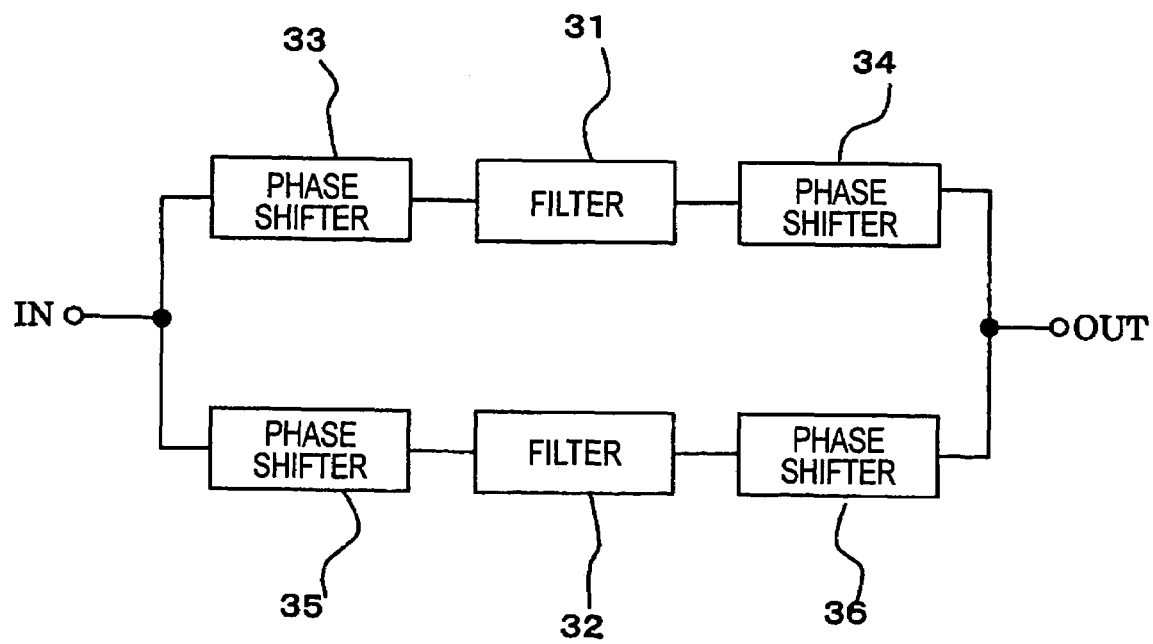
FIG. 15 is a block diagram of a multiband filter circuit according to a first prior art.
Figure 16:
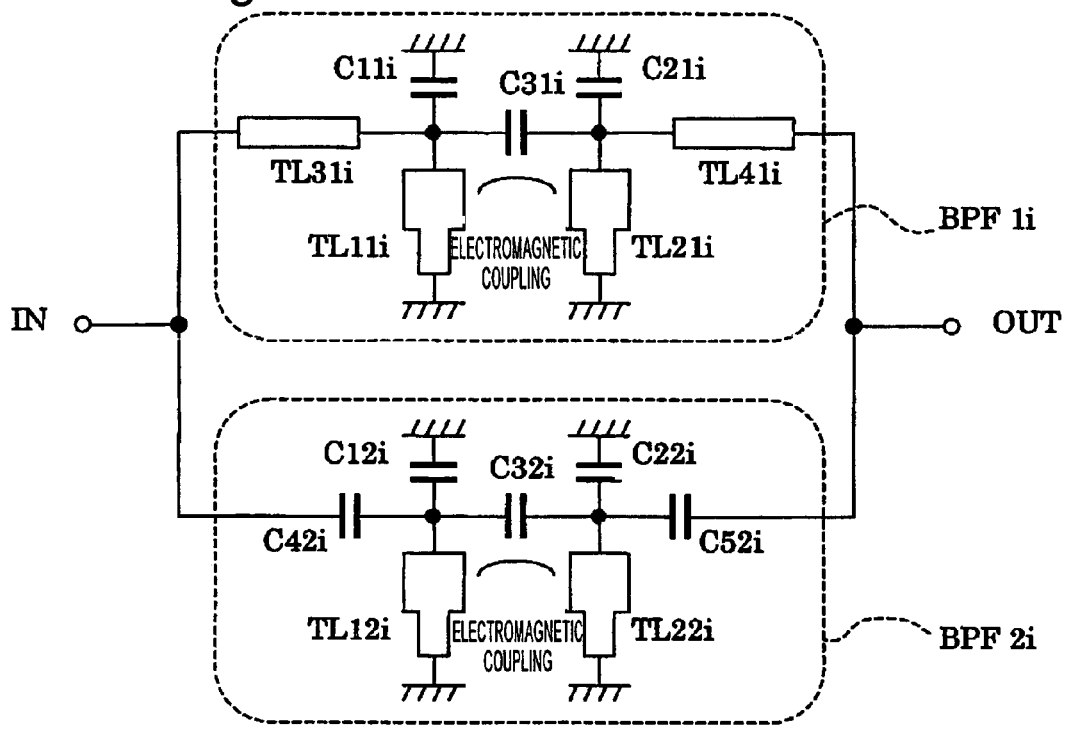
FIG. 16 is a block diagram of a multiband filter circuit according to a second prior art.

The multiband filter circuit of the first embodiment of FIG. 1 does not need a phase shifter or a phase line, which has been indispensable in the first prior art (FIG. 15) and the second prior art (FIG. 16). All of the circuit elements are the elements that can be provided by lumped constant components in a low frequency band. Therefore, for example, even in a comparatively low frequency band like the 1-to-2 GHz band often used for portable telephones (i.e., frequency band of a long wavelength $\lambda$), it is possible to provide the circuit compactly with a light weight.

Figure 2:
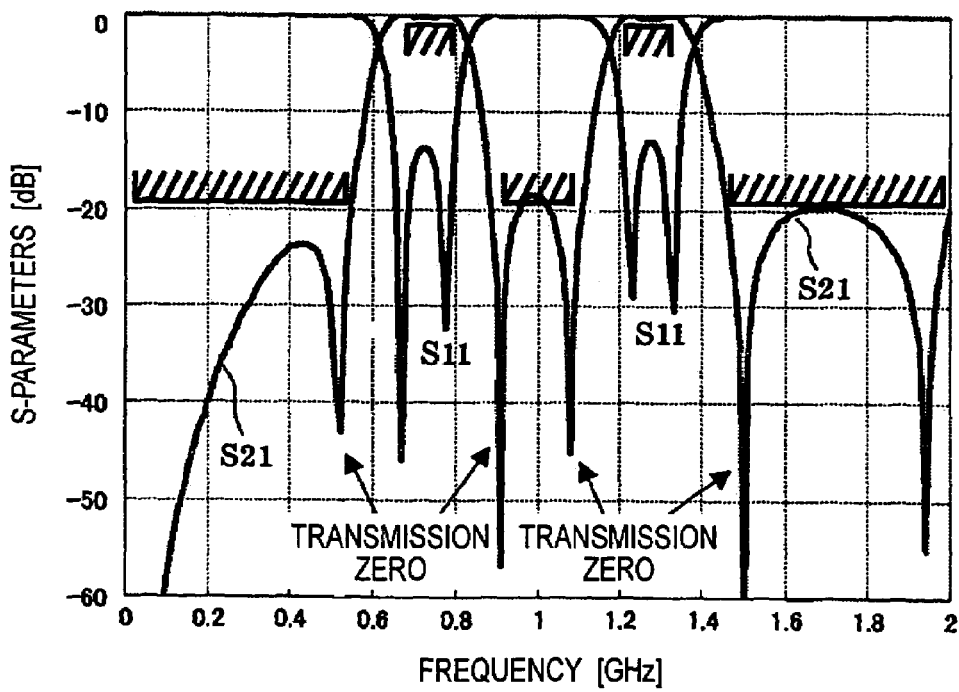
FIG. 2 is one example of the simulation results of the above multiband filter circuit.

FIG. 2 shows one example of simulation results when the multiband filter circuit of FIG. 1 is optimally designed, and the objective design specifications in the case are shown in Table 1. The circuit constants when the results were obtained were as follows.

C11a=C21a=6.873 pF, C31a=C51a=4.553 pF, C41a=2.518 pF, L11a=L21a=4.613 nH, L31a=L41a=7.427 nH, K1a=0.17,

C12a=C22a=5.31 pF, C32a=C52a=1.752 pF, C42a=0.817 pF, L12a=L22a=2.155 nH, L32a=L42a=6.797 nH, K2a=9.087×10$^{-3}$.

TABLE 1

| Frequency band [MHz] | | Objective Specification |
|---|---|---|
| Stopband | 0–550 | $|S21| < -20$ dB |
| Passband | 650–800 | $|S11| < -15$ dB |
| Stopband | 880–1120 | $|S21| < -20$ dB |
| Passband | 1200–1350 | $|S11| < -15$ dB |
| Stopband | 1450–2000 | $|S21| < -20$ dB |

In the graph of FIG. 2, a total of four transmission zeros, two of which are located in the vicinity of both sides of a passband and the other two of which are located in the vicinity of both sides of another passband, are generated. Moreover, these transmission zeros can be arranged very close to each of the passbands without hindering the impedance matching in each of the passbands. As a result, a filter characteristic of a high steepness can be achieved, and this can almost satisfy the design conditions of Table 1.

Second Embodiment

The multiband filter circuit of the present invention has a very regular structure as shown in FIG. 7. Therefore, if the number of filter circuits is increased to increase the number of stages, the number of passbands can easily be increased.

Figure 3:
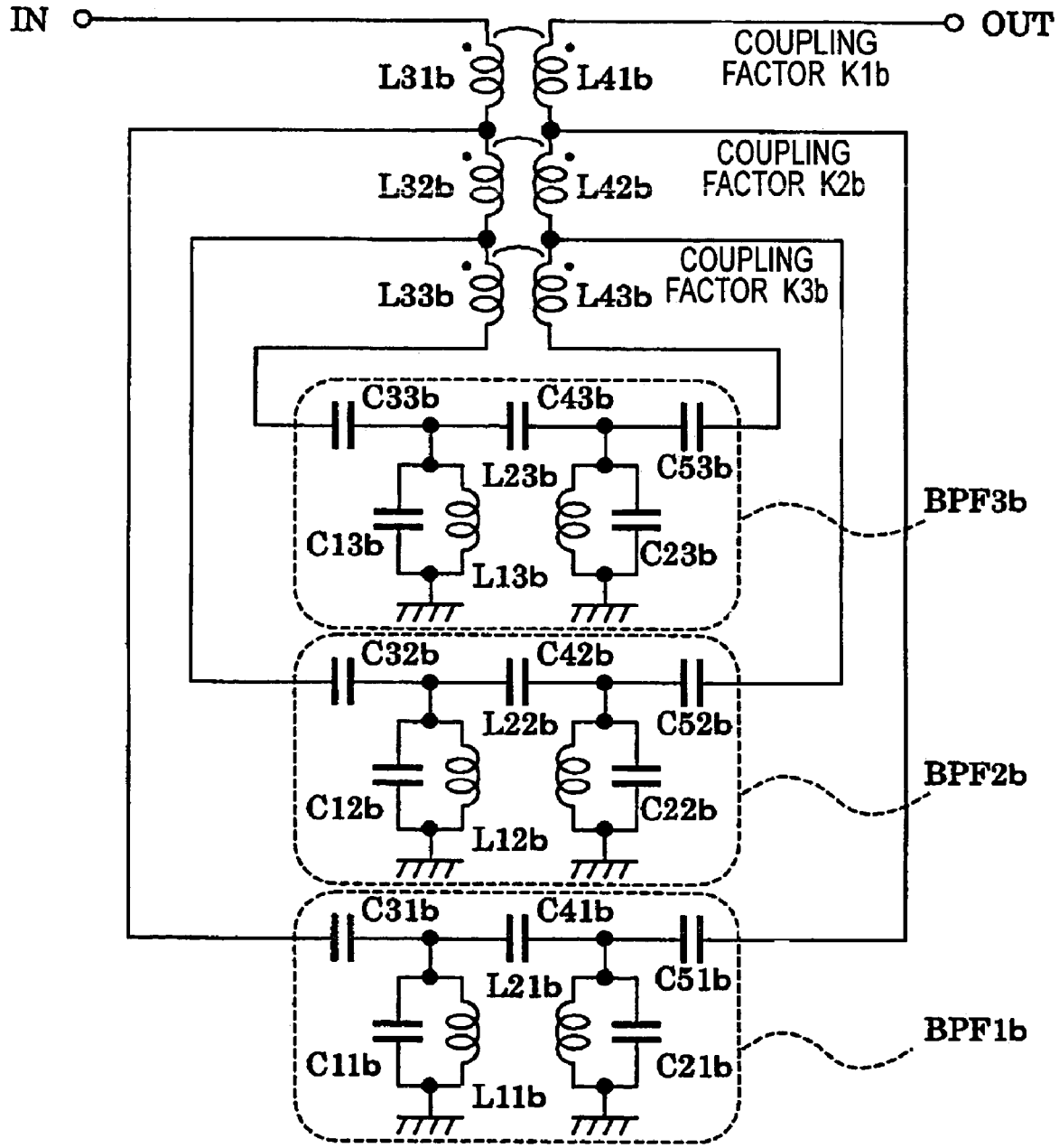
FIG. 3 is a concrete circuit diagram of a multiband filter circuit according to a second embodiment of the present invention.

FIG. 3 is a concrete example of the second embodiment in which the number N of passbands is increased to N=3 in the multiband filter circuit of the first embodiment of the present invention of FIG. 1. In FIG. 3, one inductance component L31b of the first mutual inductance is connected between the input port IN and the input side of a bandpass filter circuit BPF1b, while the other inductance component L41b of the first mutual inductance is connected between the output port OUT and the output side of the bandpass filter circuit BPF1b. By the first mutual inductance, the input side and the output side of the first bandpass filter circuit BPF1b are magnetically coupled to each other in a jump-coupling manner. One inductance component L32b of the second mutual inductance is connected between the input side of the first bandpass filter circuit BPF1b and the input side of a second bandpass filter circuit BPF2b, while the other inductance component L42b of the second mutual inductance is connected between the output side of the first bandpass filter circuit BPF1b and the output side of the second bandpass filter circuit BPF2b. By the second mutual inductance, the input side and the output side of the second bandpass filter circuit BPF2b are magnetically coupled to each other in a jump-coupling manner. Further, one inductance component L33b of the third mutual inductance is connected between the input side of the second bandpass filter circuit BPF2b and the input side of a third bandpass filter circuit BPF3b, while the other inductance component L43b of the third mutual inductance is connected between the output side of the second bandpass filter circuit BPF2b and the output side of the third bandpass filter circuit BPF3b. By the third mutual inductance, the input side and the output side of the third bandpass filter circuit BPF3b are magnetically coupled to each other in a jump-coupling manner.

The two inductance components L31b and L41b of the first mutual inductance are coupled to each other by a coupling factor K1b. The two inductance components L32b and L42b of the second mutual inductance are coupled to each other by a coupling factor K2b. The two inductance components L33b and L43b of the third mutual inductance are coupled to each other by a coupling factor K3b.

The first bandpass filter circuit BPF1b has a structure in which three series capacitances C31b, C41b and C51b and two LC parallel resonators (the pair of C11b and L11b and the pair of C21b and L21b) are alternately connected in multiple stages. The second bandpass filter circuit BPF2b has a structure in which three series capacitances C32b, C42b and C52b and two LC parallel resonators (the pair of C12b and L12b and the pair of C22b and L22b) are alternately connected in multiple stages. The third bandpass filter circuit BPF3b has a structure in which three series capacitances C33b, C43b and C53b and two LC parallel resonators (the pair of C13b and L13b and the pair of C23b and L23b) are alternately connected in multiple stages.

Figure 4:
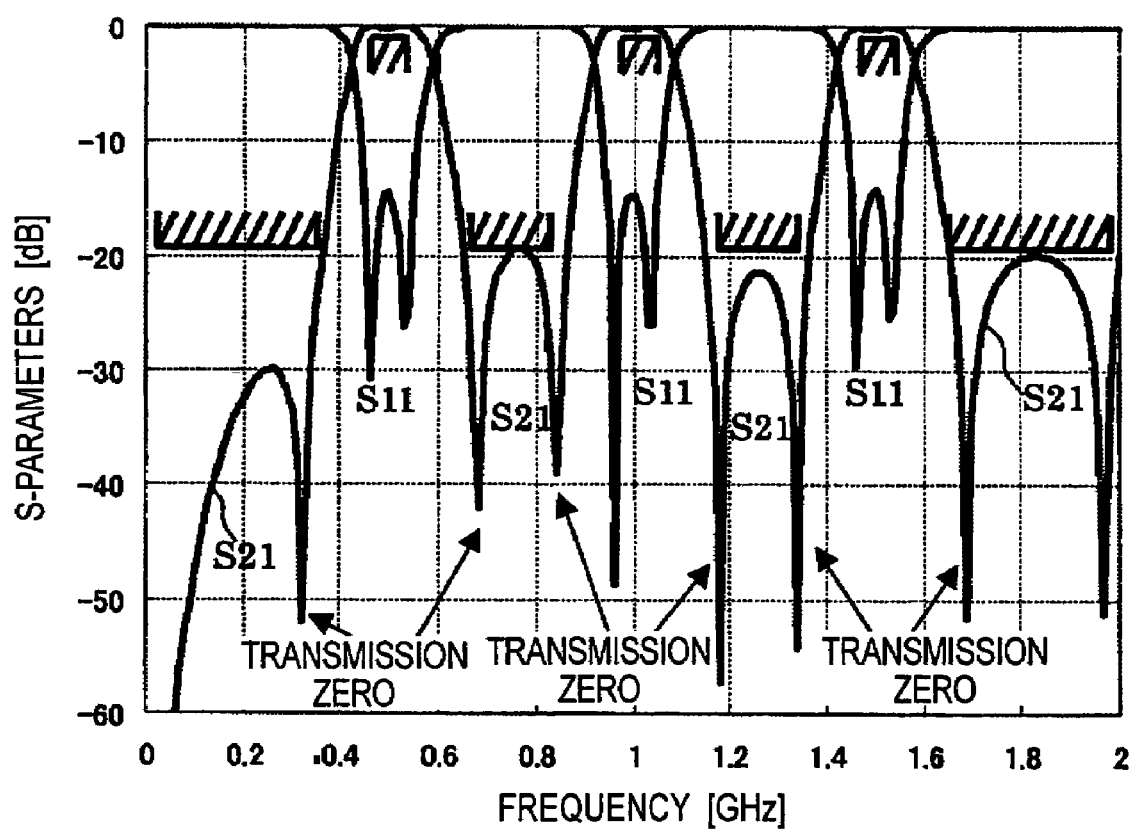
FIG. 4 is one example of the simulation results of the above multiband filter circuit shown in FIG. 3.

FIG. 4 shows one example of simulation results when the multiband filter circuit of FIG. 3 is optimally designed, and the objective design specifications in the case are shown in Table 2. It can be confirmed that a steep bandpass characteristic can be achieved with three passbands existing and with a total of six transmission zeros generated on the lower region side and the higher region side of each passband. The circuit constants when the results were obtained were as follows.

C11b=C21b=6.355 pF, C31b=C51b=8.992 pF, C41b=3.191 pF, L11b=L21b=8.039 nH, L31b=L41b=5.789 nH, K1b=0.193, $C12b=C22b=3.767$ pF, $C32b=C52b=2.813$ pF, $C42b=0.57$ pF, $L12b=L22b=4.18$ nH, $L32b=L42b=4.305$ nH, $K2b=8.928e-15$, $C13b=C23b=2.443$ pF, $C33b=C53b=1.238$ pF, $C43b=0.25$ pF, $L13b=L23b=2.443$ nH, $L33b=L43b=2.673$ nH, $K3b=35.94\times10^{-15}$.

TABLE 2

| Frequency band [MHz] | | Objective Specification |
|---|---|---|
| Stopband | 0-350 | $|S21| < -20$ dB |
| Passband | 450-550 | $|S11| < -15$ dB |
| Stopband | 650-850 | $|S21| < -20$ dB |
| Passband | 950-1050 | $|S11| < -15$ dB |
| Stopband | 1150-1350 | $|S21| < -20$ dB |
| Passband | 1450-1550 | $|S11| < -15$ dB |
| Stopband | 1650-2000 | $|S21| < -20$ dB |

Third Embodiment

Depending on filter design specifications, a great attenuation is often required only in a local narrow frequency band. In order to cope with the above-mentioned requirement, it is advantageous that the number of transmission zeros to be generated is as great as possible. However, increasing the number of transmission zeros means newly adding a trap circuit, and this generally disadvantageously incurs a problem that the circuit scale is increased. In contrast to this, the multiband filter circuit of the third embodiment of the present invention has a feature that the number of transmission zeros can easily be increased by adding only one capacitance.

Figure 8:
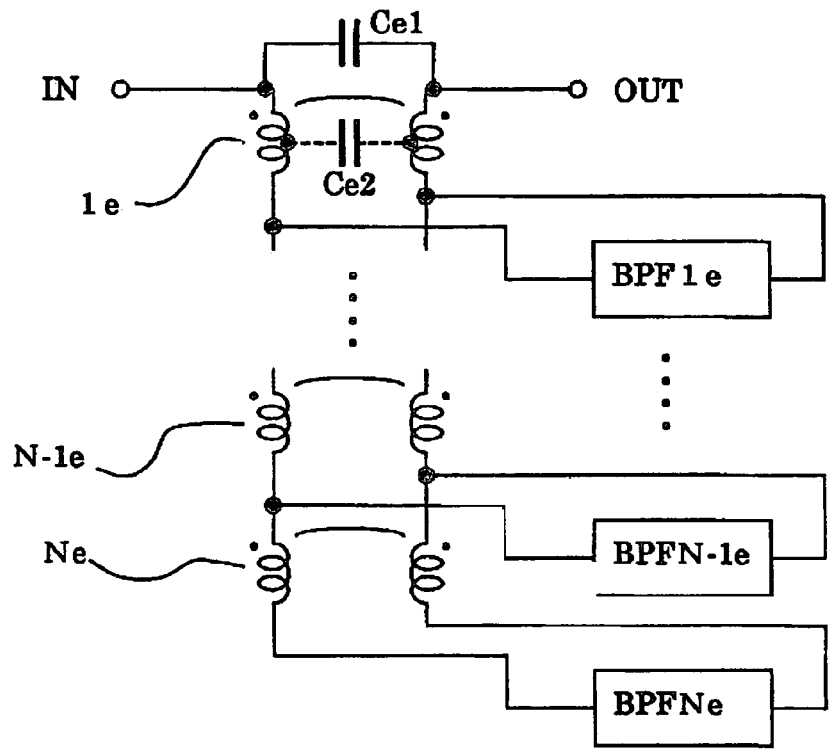
FIG. 8 is a schematic structural view of the multiband filter circuit of the third embodiment of the present invention.

FIG. 8 is a structural view of the principle of such a multiband filter circuit according to the third embodiment of the present invention. As shown in FIG. 8, this multiband filter circuit is obtained by further adding a jump-coupling capacitance Ce1 between the input and output ports to the same construction as that of the multiband filter circuit of the first embodiment shown in FIG. 7.

With regard to the position of the jump-coupling capacitance, it is acceptable to connect the capacitance between the input and output ports IN and OUT like Ce1 in FIG. 8 or provide a capacitance for connecting the mutually opposite connection points of the mutual inductance or provide a capacitance for connecting the intermediate points of two inductance components that constitute a mutual inductance like Ce2 in FIG. 8.

Figure 5:
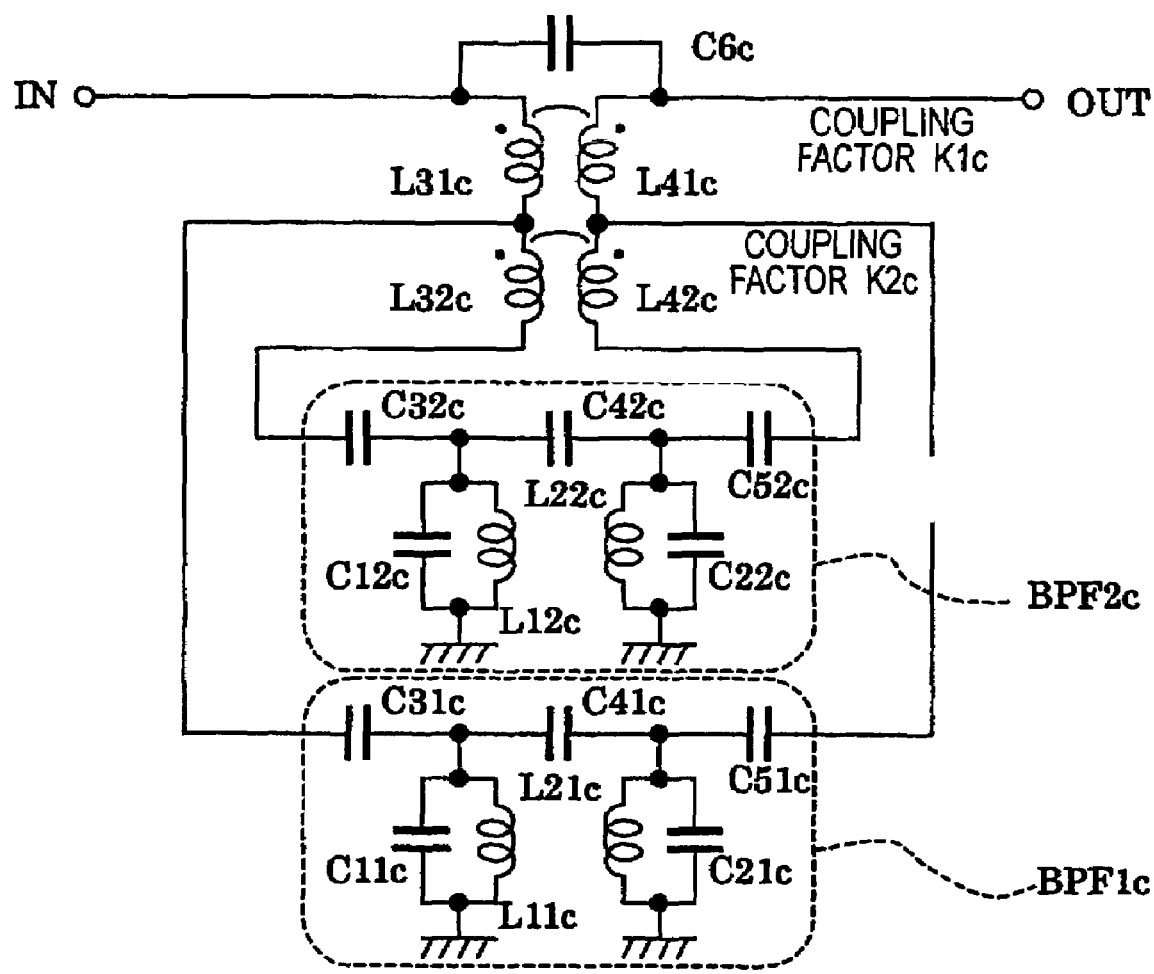
FIG. 5 is a concrete circuit diagram of a multiband filter according to a third embodiment of the present invention shown in FIG. 8.

FIG. 5 is a concretely materialized example in which the multiband filter circuit of the third embodiment has N=2. In FIG. 5, one inductance component L31c of the first mutual inductance is connected between the input port IN and the input side of a first bandpass filter circuit BPF1c, while the other inductance component L41c of the first mutual inductance is connected between the output port OUT and the output side of the first bandpass filter circuit BPF1c. By the first mutual inductance, the input side and the output side of the first bandpass filter circuit BPF1c are magnetically coupled to each other in a jump-coupling manner. One inductance component L32c of the second mutual inductance is connected between the input side of the first bandpass filter circuit BPF1c and the input side of a second bandpass filter circuit BPF2c, while the other inductance component L42c of the second mutual inductance is connected between the output side of the first bandpass filter circuit BPF1c and the output side of the second bandpass filter circuit BPF2c. By the second mutual inductance, the input side and the output side of the second bandpass filter circuit BPF2c are magnetically coupled to each other in a jump-coupling manner. The input and output ports IN and OUT of the entire circuit described above are coupled to each other in a jump-coupling manner also by a capacitance component C6c.

The two inductance components L31c and L41c of the first mutual inductance are coupled to each other by a coupling factor K1c, while the two inductance components L32c and L42c of the second mutual inductance are coupled to each other by a coupling factor K2c.

The first bandpass filter circuit BPF1c has a structure in which three series capacitances C31c, C41c and C51c and two LC parallel resonators (the pair of C11c and L11c and the pair of C21c and L21c) are alternately connected in multiple stages. The second bandpass filter circuit BPF2c has a structure in which three series capacitances C32c, C42c and C52c and two LC parallel resonators (the pair of C12c and L12c and the pair of C22c and L22c) are alternately connected in multiple stages.

Figure 6:
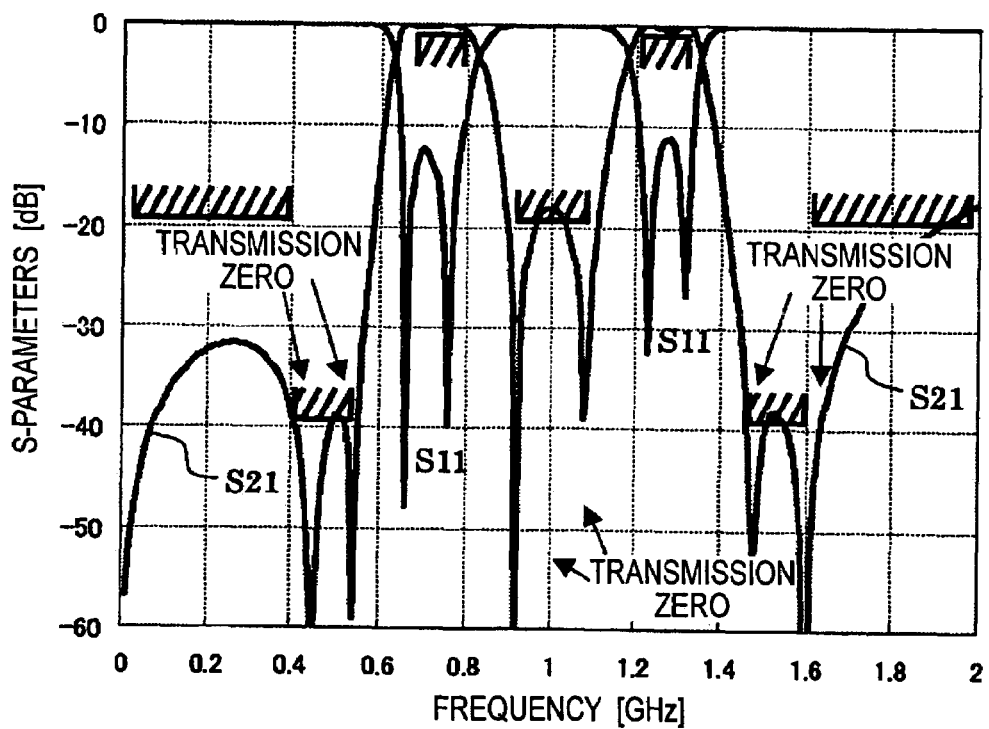
FIG. 6 is one example of the simulation results of the circuit of FIG. 5.

FIG. 6 shows one example of simulation results when the multiband filter circuit of FIG. 5 is optimally designed, and the objective design specifications in the case are shown in Table 3. It was assumed that a high attenuation of up to 40 dB was needed in the frequency bands located adjacently on the higher and lower sides of the two passbands. According to the graph of FIG. 6, the number of transmission zeros, which has been four in the already described circuit of FIG. 1, is increased to six merely by adding one capacitance C6c. Moreover, two sets of two transmission zeros among the transmission zeros that has been increased to six in number are arranged in the high-attenuation bands, and it is consequently successful to locally largely improve the attenuation. The circuit constants when the results were obtained were as follows.

$C11c=C21c=7.174$ pF, $C31c=C51c=2.189$ pF, $C41c=1.923$ pF, $L11c=L21c=4.847$ nH, $L31c=L41c=9.761$ nH, $K1c=0.134$, $C12c=C22c=5.835$ pF, $C32c=C52c=1.216$ pF, $C42c=0.703$ pF, $L12c=L22c=2.248$ nH, $L32c=L42c=5.52$ nH, $K2c=0.067$, $C6c=0.231$ pF.

TABLE 3

| Frequency band [MHz] | | Objective Specification |
|---|---|---|
| Stopband | 0-450 | $|S21| < -20$ dB |
|  | 450-550 | $|S21| < -40$ dB |
| Passband | 650-800 | $|S11| < -15$ dB |
| Stopband | 880-1120 | $|S21| < -20$ dB |
| Passband | 1200-1350 | $|S11| < -15$ dB |
| Stopband | 1450-1550 | $|S21| < -40$ dB |
|  | 1550-2000 | $|S21| < -20$ dB |

Fourth Embodiment

In the multiband filter circuit of the present invention, means for achieving the jumping magnetic field coupling is not limited to the lumped-constant mutual inductance component (1d through Nd) as in FIG. 7, and it is possible to use a coupled line pair of a distributed constant equivalent to it.

Figure 9:
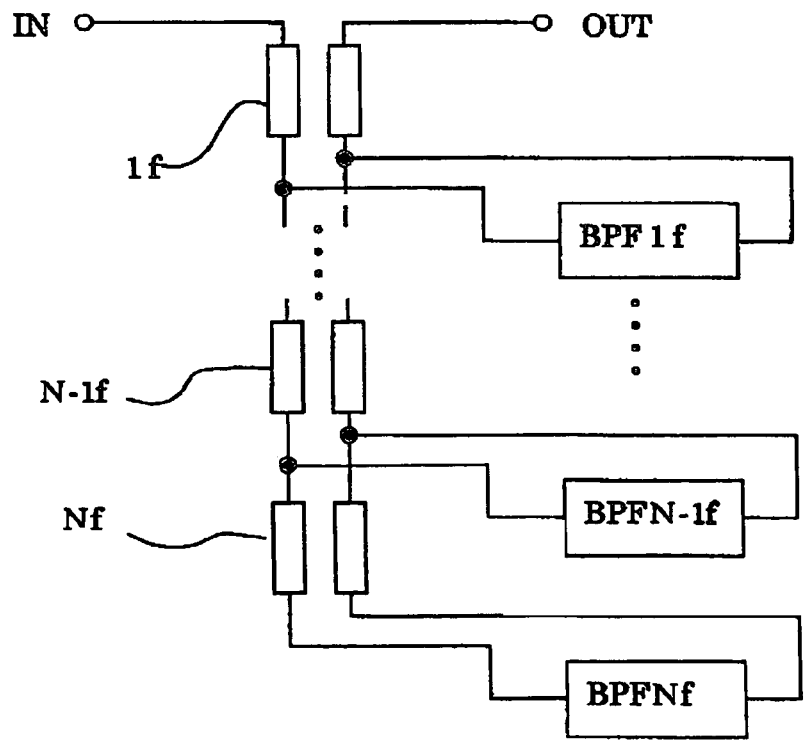
FIG. 9 is a schematic structural view of the multiband filter circuit of the fourth embodiment of the present invention.

FIG. 9 shows a multiband filter circuit according to the fourth embodiment of the present invention employing such distributed constant coupled line pairs (1f through Nf).

Figure 10:
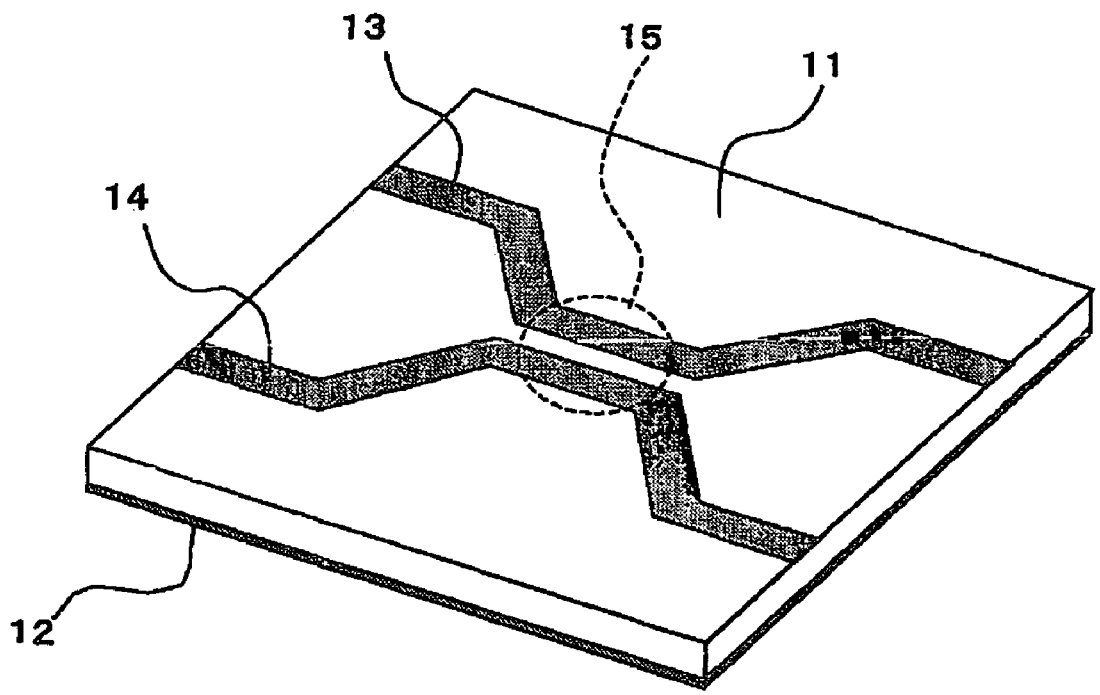
FIG. 10 is a schematic view showing the mechanism of magnetic field coupling between high-frequency transmission lines shown in FIG. 9.
Figure 11:
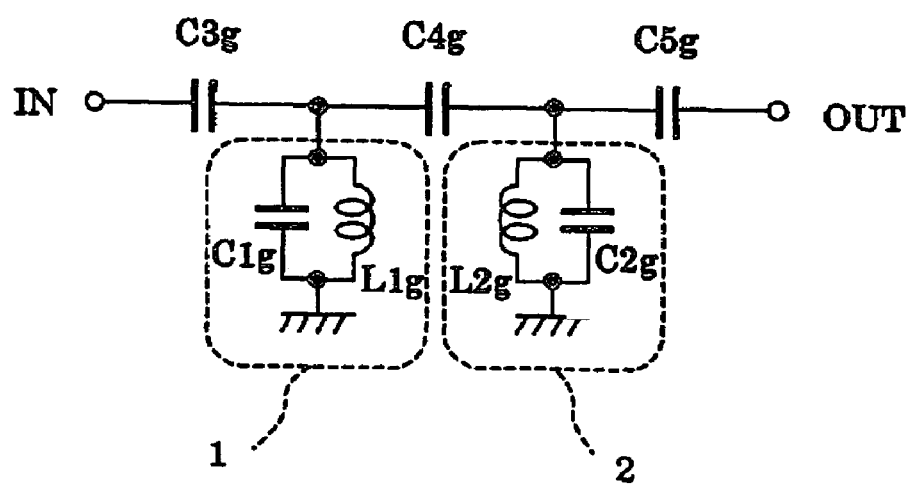
FIG. 11 is one example of a prior art bandpass filter circuit.
Figure 12:
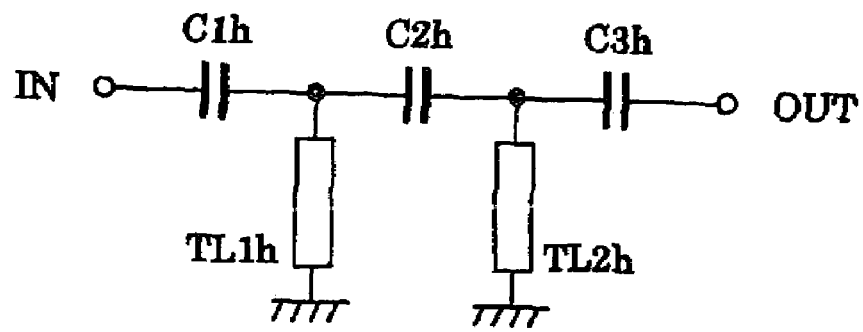
FIG. 12 is another one example of a prior art multiband filter circuit.
Figure 13:
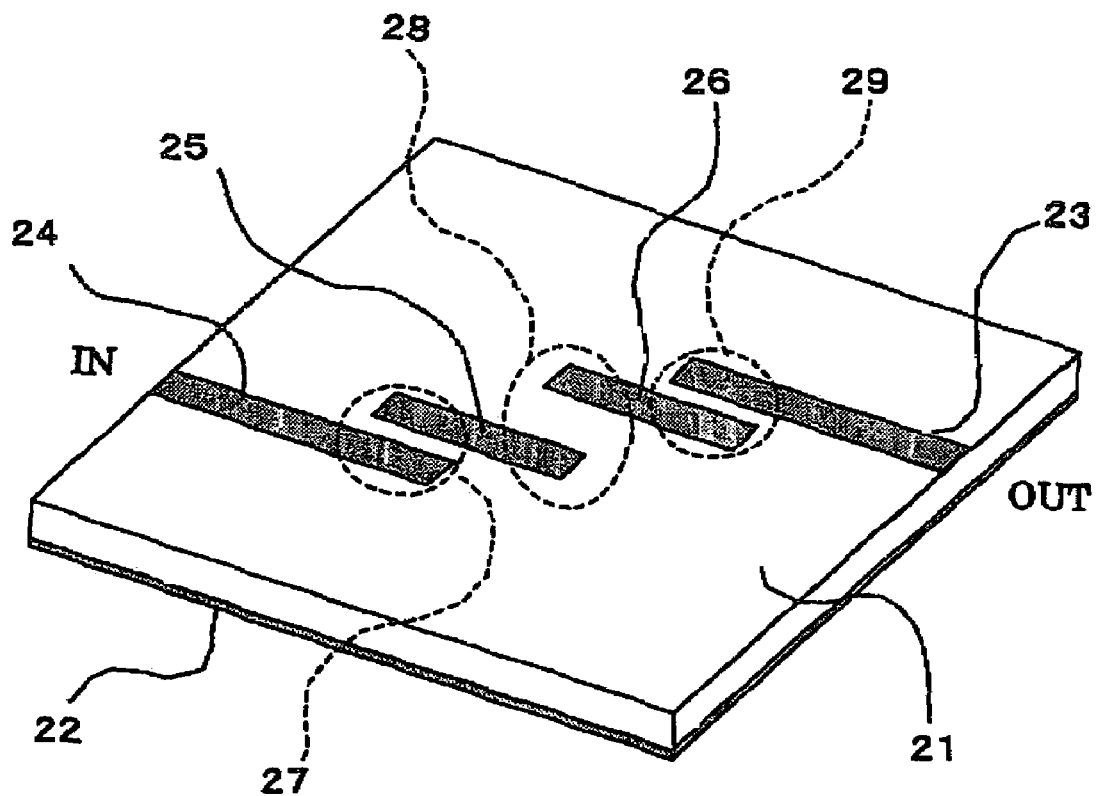
FIG. 13 is another one example of a prior art multiband filter circuit.
Figure 14:
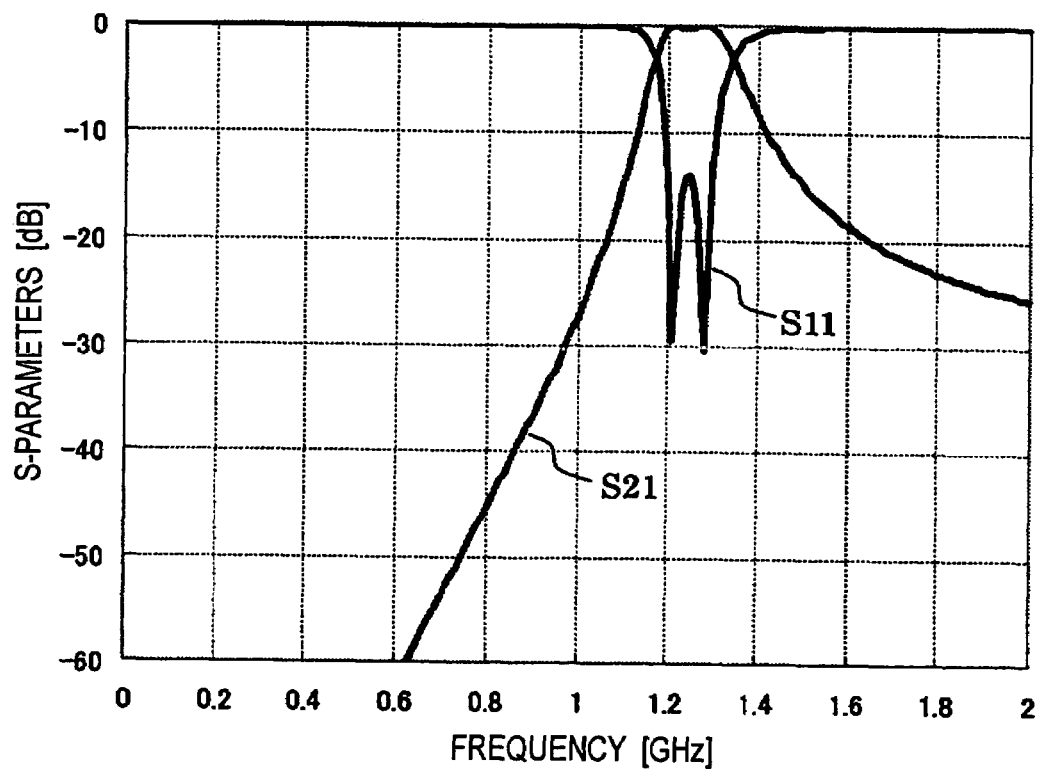
FIG. 14 is one example of the simulation results of the above multiband filter circuit shown in FIG. 11.

FIG. 10 is a schematic view showing the appearance of magnetic field coupling between such a high-frequency transmission line pair. In FIG. 10, there are shown a dielectric substrate 12 of ceramic or the like, a ground pattern 12 on the lower surface of the substrate and high-frequency transmission lines 13 and 14 formed of a metal wiring pattern on the upper surface of the substrate. By arranging the high-frequency transmission lines 13 and 14 partially adjacent and roughly parallel to each other with interposition of prescribed spacing as indicated by the reference numeral 15 in FIG. 10, this portion operates as a coil pair (transformer circuit) of a very short dimension, and electromagnetic field coupling mainly constituted of magnetic field coupling is generated.

Fifth Embodiment

With regard to the recent various radio communication systems, there is an increasing number of so-called multiband systems in which a plurality of separate frequency bands are allocated in accordance with the limitations of frequency resources. As a typical example, there is a so-called dual-band portable telephone conforming to both of GSM (800-MHz band) and DCS (1.8-GHz band) of European portable telephone systems.

An example of the prior art triple-band high frequency transmitter that conforms to all of three frequency bands (assumed as f1 through f3) will be described below with reference to FIGS. 17 and 18, and the high frequency transmitter according to the fifth embodiment of the present invention will be described with reference to FIG. 19.

Figure 17:
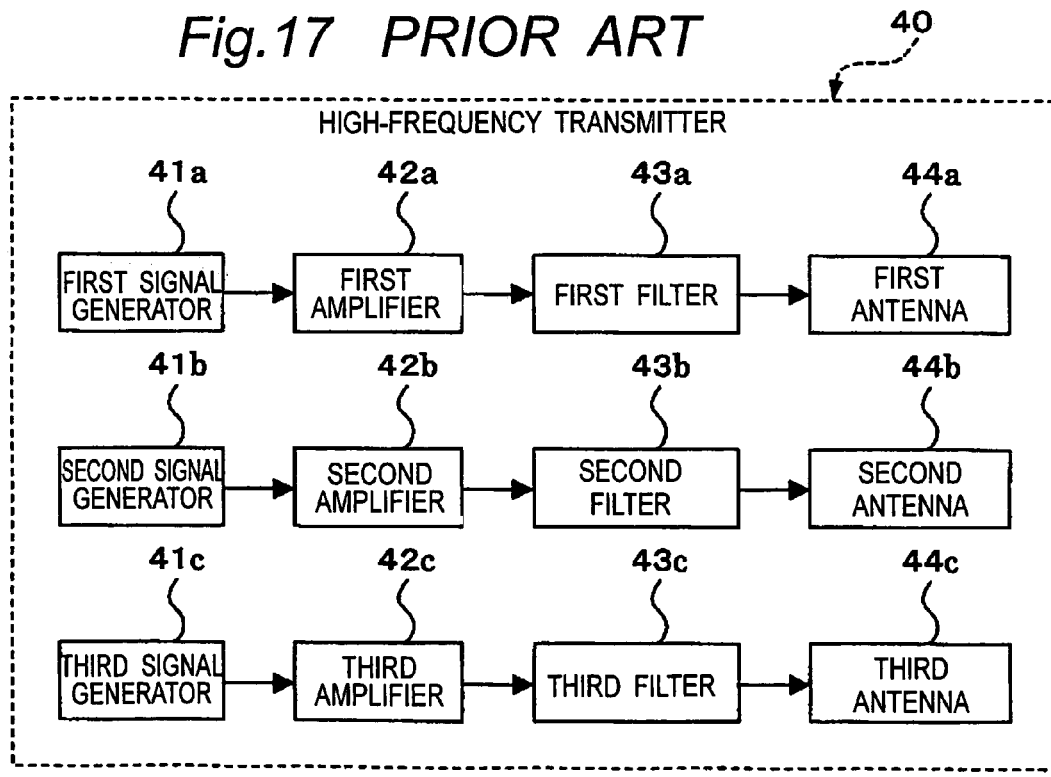
FIG. 17 is a block diagram of the transmission side of a prior art triple-band high frequency transmitter.

FIG. 17 is a schematic block diagram of a prior art triple-band high frequency transmitter 40. For the sake of simplicity of explanation, only the transmission circuit system is selectively shown in the figure. In FIG. 17, a signal in the frequency band f1 is generated in a first signal generator 41a, amplified in a first amplifier 42a, band-limited in a first filter 43a and radiated from a first antenna 44a. A signal in the frequency band f2 is generated in a second signal generator 41b, amplified in a second amplifier 42b, band-limited in a second filter 43band radiated from a second antenna 44b. A signal in the frequency band f3 is generated in a third signal generator 41c, amplified in a third amplifier 42c, band-limited in a third filter 43c and radiated from a third antenna 44c. As described above, three circuit systems conforming to the three frequency bands (f1 through f3) have coexisted in one device with a complicated and large-scale circuit structure in the prior art.

The prior art high frequency transmitter of FIG. 17 cannot avoid increasing the size, weight and cost of the device, and accordingly, there is an ongoing attempt to share the components as far as possible between the three circuit systems.

Figure 18:
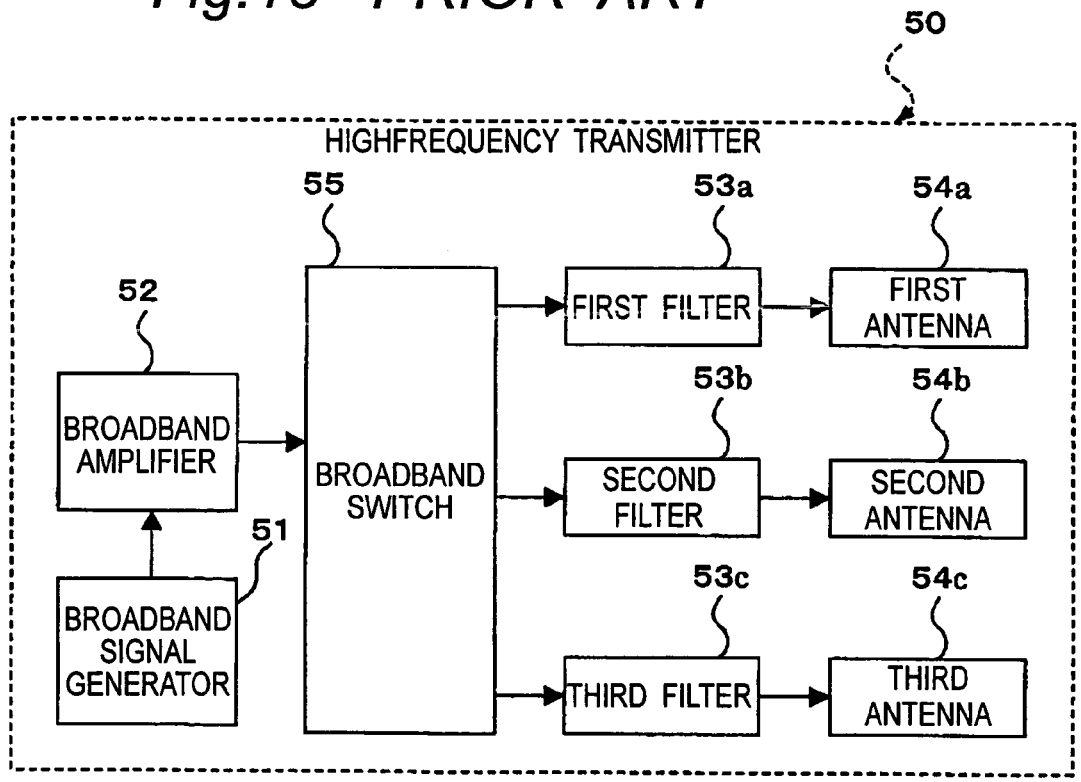
FIG. 18 is a block diagram of the transmission side of a prior art triple-band high frequency transmitter.

Moreover, FIG. 18 shows an example of the block diagram of a prior art high frequency transmitter 50, in which the circuit being shared among the three frequency bands (f1 through f3) is promoted by widening the bandwidth of the circuits (amplifier and signal generator). The circuit is rather simplified than that of FIG. 17.

In FIG. 18, a broadband signal generator 51 is able to generate all of the signals of the three frequency bands (f1 through f3), and a broadband amplifier 52 is able to amplify all of the signals of the three frequency bands (f1 through f3). In the stages behind the amplifier 52, the circuit system is switched by a broadband switch 55. The signal in the frequency band f1 is band-limited by a first filter 53a and radiated from a first antenna 54a. The signal in the frequency band f2 is band-limited by a second filter 53b and radiated from a second antenna 54b. The signal in the frequency band f3 is band-limited by a third filter 53c and radiated from a third antenna 54c.

As shown in FIG. 18, the method of sharing the circuit among a plurality of frequency bands (f1 through f3) by widening the bandwidth of the circuit has widely been known as a very effective technique for simplifying the circuit. However, there is only one component to which the above-mentioned sharing technique cannot be applied in principle, and it is the filter circuit. This is for the reason that the filter component is a component that has an importance of existence in limiting a signal into a narrow band, and this is utterly inconsistent with the aforementioned trend of widening the bandwidth.

A component necessary for eliminating this inconsistency is a multiband filter circuit. However, although there has been known the circuit structure (e.g., FIGS. 15 and 16) that has two passbands (e.g., f1 and f2) according to the prior art multiband filter circuit, there has not been known a practical circuit structure capable of coping with the triple band, to which attention is paid in the present embodiment.

According to the multiband filter circuit of the present invention, there can be constructed a bandpass filter circuit theoretically conforming to not only the triple band but also an arbitrary number of frequency bands. Therefore, if the present invention is used, it is possible to further promote the sharing and simplifying of the circuit than in FIG. 18.

Figure 19:
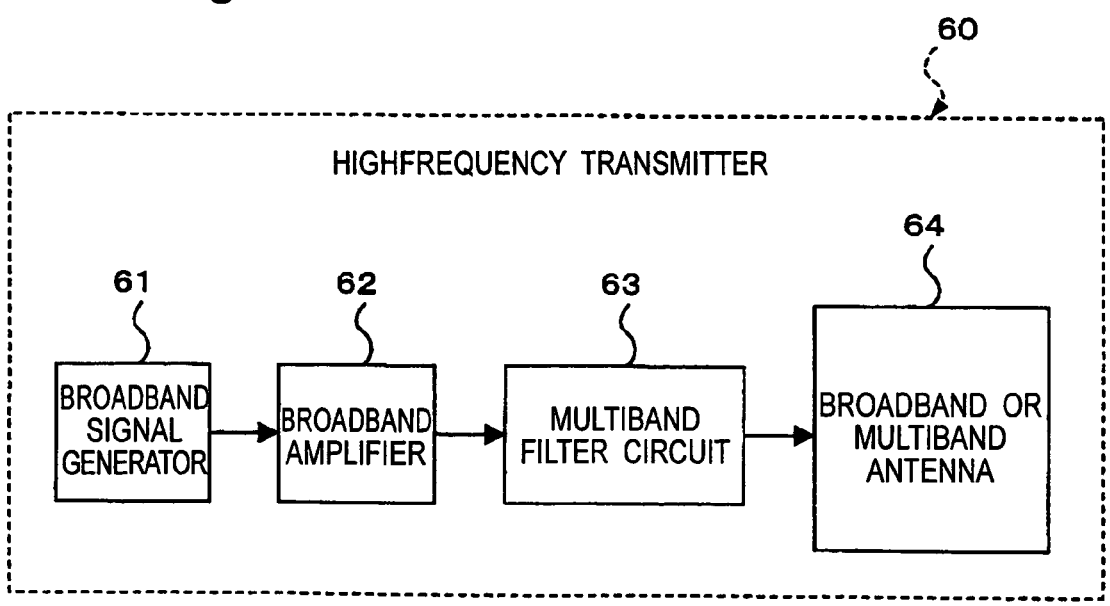
FIG. 19 is a block diagram of the transmission side of a high frequency transmitter according to a fifth embodiment of this invention.

FIG. 19 is an ultimate block diagram of a high frequency transmitter 60 according to the fifth embodiment to which the present invention is applied. The circuits of a signal generator 61, an amplifier 62 and a broadband (or multiband) antenna 64 shown in FIG. 19 are made to have a broadband and shared by three frequency bands (f1 through f3). With regard to the multiband filter circuit 63 for which the narrow band characteristic is indispensable, one filter circuit is shared by three frequency bands (f1 through f3) by applying the embodiment of the present invention that has three passbands as shown in FIG. 3.

As described above, by employing the multiband filter circuit of the present invention as an RF filter, it becomes possible to not only reduce the size of the single unit of the filter circuit but also simplify the block diagram construction of the entire high frequency transmitter. With this arrangement, it becomes possible to provide a small, lightweight and low-cost high frequency transmitter.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A multiband filter circuit including:
   a first bandpass filter circuit;
   a second bandpass filter circuit having a center frequency higher than that of the first bandpass filter circuit;
   first mutual inductance having an inductance component connected between an input port and an input side of the first bandpass filter circuit and an inductance component connected between an output port and an output side of the first bandpass filter circuit; and
   second mutual inductance having an inductance component connected between the input side of the first bandpass filter circuit and an input side of the second bandpass filter circuit and an inductance component connected between the output side of the first bandpass filter circuit and an output side of the second bandpass filter circuit, wherein the input side and the output side of the first bandpass filter circuit are magnetically coupled to each other in a jump-coupling manner by the first mutual inductance, and the input side and the output side of the second bandpass filter circuit are magnetically coupled to each other in a jump-coupling manner by the second mutual inductance.

2. The multiband filter circuit as claimed in claim 1, wherein the input port and the output port are coupled to each other additionally by a capacitance component, or mutually opposite connection points of the mutual inductances are coupled to each other by a capacitance component or intermediate points of two inductance components that constitute the mutual inductance are coupled to each other by a capacitance component.

3. The filter circuit as claimed in claim 2, wherein the mutual inductance is provided by magnetic coupling between two high-frequency transmission lines arranged roughly parallel to each other at a prescribed interval.

4. The filter circuit as claimed in claim 1, wherein the mutual inductance is provided by magnetic coupling between two high-frequency transmission lines arranged roughly parallel to each other at a prescribed interval.

5. A high frequency transmitter employing the multiband filter circuit claimed in claim 1 as an RF filter for electric wave interference prevention in an ultrawide waveband radio communication system.

6. A multiband filter circuit including:

a plurality of first through N-th (N: an integer not smaller than two) bandpass filter circuits arranged in an ascending order of intermediate frequency and a plurality of first through N-th mutual inductances, wherein one inductance component of the first mutual inductance is connected between an input port and an input side of the first bandpass filter circuit, the other inductance component of the first mutual inductance is connected between an output port and an output side of the first bandpass filter circuit, the input side and the output side of the first bandpass filter circuit are magnetically coupled to each other in a jump-coupling manner by the first mutual inductance, one inductance component of an (n+1)-st (n=1, . . . , N−1) bandpass filter circuit is connected between an input side of an n-th bandpass filter circuit and an input side of the (n+1)-st bandpass filter circuit, the other inductance component of the (n+1)-st bandpass filter circuit is connected between an output side of the n-th bandpass filter circuit and an output side of the (n+1)-st bandpass filter circuit, and the input side and the output side of the (n+1)-st bandpass filter circuit are magnetically coupled to each other in a jump-coupling manner by the (n+1)-st mutual inductance.

7. The multiband filter circuit as claimed in claim 6, wherein the input port and the output port are coupled to each other additionally by a capacitance component, or mutually opposite connection points of the mutual inductances are coupled to each other by a capacitance component or intermediate points of two inductance components that constitute the mutual inductance are coupled to each other by a capacitance component.

8. The filter circuit as claimed in claim 7, wherein the mutual inductance is provided by magnetic coupling between two high-frequency transmission lines arranged roughly parallel to each other at a prescribed interval.

9. The filter circuit as claimed in claim 6, wherein the mutual inductance is provided by magnetic coupling between two high-frequency transmission lines arranged roughly parallel to each other at a prescribed interval.

10. A high frequency transmitter employing the multiband filter circuit claimed in claim 6 as an RF filter for electric wave interference prevention in an ultrawide waveband radio communication system.

* * * * *